US009536511B2

(12) United States Patent
Bautista et al.

(10) Patent No.: US 9,536,511 B2

(45) Date of Patent: Jan. 3, 2017

(54) ULTRASOUND TRANSDUCER STACK

(71) Applicant: ACIST Medical Systems, Inc., Eden Prairie, MN (US)

(72) Inventors: Rick Bautista, Palo Alto, CA (US); Kendall R. Waters, Livermore, CA (US)

(73) Assignee: ACIST Medical Systems, Inc., Eden Prairie, MN (US)

(*) Notice: Subject to any disclaimer, the term of this patent is extended or adjusted under 35 U.S.C. 154(b) by 361 days.

(21) Appl. No.: 14/144,799

(22) Filed: Dec. 31, 2013

(65) Prior Publication Data

US 2015/0182998 A1 Jul. 2, 2015

(51) Int. Cl.

*H01L 41/08* (2006.01)
*G10K 11/02* (2006.01)
*B06B 1/06* (2006.01)

(52) U.S. Cl.

CPC ............... *G10K 11/02* (2013.01); *B06B 1/067* (2013.01)

(58) Field of Classification Search

CPC ................................ H04R 17/00; B06B 1/911
USPC ................. 310/320–233, 326, 327, 334, 367
See application file for complete search history.

(56) References Cited

U.S. PATENT DOCUMENTS 2,833,999 A * 5/1958 Howry .................. G01N 29/24 192/12 D
5,065,068 A * 11/1991 Oakley .................... B06B 1/06 310/334
5,415,175 A 5/1995 Hanafy
5,438,998 A 8/1995 Hanafy
5,678,554 A 10/1997 Hossack
5,971,925 A 10/1999 Hossack
5,974,884 A 11/1999 Sano et al.
5,984,871 A 11/1999 Tenhoff
6,036,648 A 3/2000 White
6,225,729 B1 5/2001 Izumi et al.
6,278,224 B1 8/2001 Sawada
6,310,426 B1 10/2001 Birchak
(Continued)

FOREIGN PATENT DOCUMENTS

EP 620048 A2 10/1994
EP 0631272 B1 11/2001
(Continued)

OTHER PUBLICATIONS

International Search Report and the Written Opinion of the International Searching Authority of co-pending application PCT/US2014/072514, Aug. 28, 2015, 10 pages, European Patent Office, Rijswijk, The Netherlands.

(Continued)

*Primary Examiner* — Thomas Dougherty
(74) *Attorney, Agent, or Firm* — Fredrikson & Byron, P.A.

(57) ABSTRACT

Certain embodiments provide an ultrasound transducer stack. The ultrasound transducer stack includes a backing layer, an active layer overlying the backing layer, and a matching layer overlying the active layer. The active layer has a surface comprising a plurality of textures. The matching layer has a first thickness region and a second thickness region, wherein the first thickness region has a larger thickness than a thickness of the second thickness region, wherein the first thickness region extends into the plurality of textures and the second thickness region does not extend into the plurality of textures.

20 Claims, 8 Drawing Sheets

(56) References Cited

U.S. PATENT DOCUMENTS

| | | | | |
|---|---|---|---|---|
| 6,371,915 | B1 | 4/2002 | Koger | |
| 6,969,943 | B2 | 11/2005 | Hashimoto | |
| 7,199,509 | B2 | 4/2007 | Kuniyasu | |
| 7,830,069 | B2 | 11/2010 | Lukacs | |
| 2001/0032511 | A1* | 10/2001 | Nagai | A61B 8/4281 73/618 |
| 2003/0032884 | A1* | 2/2003 | Smith | B06B 1/0622 600/459 |
| 2004/0113522 | A1 | 6/2004 | Nagahara | |
| 2004/0190377 | A1 | 9/2004 | Lewandowski | |
| 2005/0225211 | A1 | 10/2005 | Oliver | |
| 2007/0182290 | A1* | 8/2007 | Guo | H01L 41/37 310/367 |
| 2007/0287920 | A1 | 12/2007 | Sawada et al. | |
| 2008/0001504 | A1* | 1/2008 | Cross | H01L 41/1871 310/367 |
| 2009/0064476 | A1* | 3/2009 | Cross | H01L 41/083 29/25.35 |
| 2009/0069691 | A1 | 3/2009 | Saito | |
| 2011/0062824 | A1 | 3/2011 | Wada | |
| 2013/0072802 | A1* | 3/2013 | Hozumi | A61B 8/4444 600/472 |
| 2013/0090561 | A1 | 4/2013 | Kusukame | |
| 2013/0127297 | A1* | 5/2013 | Bautista | H01L 41/0805 310/334 |
| 2013/0200755 | A1* | 8/2013 | Kim | H01L 41/047 310/336 |

FOREIGN PATENT DOCUMENTS

| | | | |
|---|---|---|---|
| EP | 1416255 | A1 | 5/2004 |
| EP | 2405671 | A1 | 1/2012 |
| EP | 2610860 | A2 | 7/2013 |
| WO | 02052544 | A2 | 7/2002 |
| WO | 2005104210 | A2 | 11/2005 |
| WO | 2012144117 | A1 | 10/2012 |
| WO | 2014077836 | A1 | 5/2014 |

OTHER PUBLICATIONS

Ballandras et al., "Periodic arrays of transducers build using sand blasting and ultrasound micoromachining techniques for the fabrication of piezocomposite materials", 2001 IEEE Ultrasonics Symposium, pp. 871-874, 0-7803-7177-1/10, 2001 IEEE.

Comco, Inc., "Micro-Abrasive Blasting Solutions for Medical Products", 2 pages, Comco Inc., Burbank, California.

Flat Lapping, 6 pages, WEC 04/04 Machining.

International Search Authority; International Search Report of co-pending application PCT/US2012/065706, May 13, 2013, 11 pages, Korean Intellectual Property Office, Daejeon, Republic of Korea.

Performance Features and Benefits, LaserStar 990 Series iWeld Laser Welding Machine, 1 page, LaserStar Technologies Corporation, Riverside, Rhode Island.

Richter, Alan, Blast Off—Taking the 'black art' out of micro-abrasive blasting, Micro Manufacturing, Fall 2009, 5 pages, vol. 2, Issue 3, Rowley, Massachusetts.

Shaw et al., NASA Evaluation of ESD Effects During Removal of Conformal Coatings Using Micro Abrasive Blasting, Feb. 25, 2011, 13 pages, Crystal Mark, Inc., Glendale, California.

Tra-Con Tra-Duct 2902 Room Temperature Conductive Silver Epoxy Adhesive, 1 page, MatWeb.com, Tra-Con, Inc., Bedford, Massachusetts.

Safarevich et al., "Fiber Laser Welding of High Integrity Implantable Medical Devices," Crafford-LaserStar Technologies Corporation, 8 pages.

Notification of Transmittal of the International Preliminary Report on Patentability for International Pat. Application No. PCT/US2014/072514, 16 pages, mailed Jan. 12, 2016 from the International Preliminary Search Authority at the European Patent Office, Rijswijk, The Netherlands.

* cited by examiner

ULTRASOUND TRANSDUCER STACK

FIELD

The present application relates generally to transducer stacks for ultrasound transducers. The application further relates to ultrasound transducer stacks for transducers used for medical imaging.

BACKGROUND

In medical ultrasound imaging, transducer performance plays a key role in ultrasound image quality. One common type of ultrasound imaging system is the intravascular ultrasound (IVUS) system. With this system, an IVUS transducer is provided on a distal end of a catheter and the catheter is inserted into blood vessels. Common imaging targets for IVUS systems are coronary artery walls. As such, the transducers and catheters must have a small size that fits within coronary arteries. IVUS transducers are typically single-element transducers, which are small enough to fit within coronary arteries. However, single-element ultrasound transducers have inherent limitations in performance of both transducer sensitivity and bandwidth. IVUS transducers are also designed for a single use only. Once the IVUS procedure is completed, the IVUS transducer is thrown away. As such, there are cost constraints that limit the types of materials and processes that can be used to make IVUS transducers.

It would be advantageous to have an improved single-element ultrasound transducer that has a wider bandwidth and an increased sensitivity. It would also be advantageous to have an improved single-use transducer that is cost-effective to manufacture.

SUMMARY

Certain embodiments provide an ultrasound transducer stack. The ultrasound transducer stack is part of any type of ultrasound transducer, for example an IVUS transducer. The stack includes a backing layer, an active layer overlying the backing layer, and a matching layer overlying the active layer. The active layer has a surface comprising a plurality of textures.

Certain embodiments also provide a method of making an ultrasound transducer stack. The method can include steps of (a) forming a wafer and (b) dividing the wafer into segments, wherein each segment forms an ultrasound transducer stack. The step of forming a wafer can include steps of (i) providing a backing layer, (ii) providing an active layer overlying the backing layer, (iii) forming a plurality of textures on a surface of the active layer, and (iv) providing a matching layer over the surface of the active layer.

The matching layer has a first thickness region and a second thickness region, wherein the first thickness region has a larger thickness than a thickness of the second thickness region. The first thickness region extends into the plurality of textures and the second thickness region does not extend into the plurality of textures. In some cases, the first thickness region matches a first frequency and the second thickness region matches a second frequency, wherein the first frequency is higher than the second frequency. In one example, the first frequency is 60 MHz and the second frequency is 40 MHz. In other cases, the first thickness region has a thickness of $\frac{3}{4}\lambda$ and the second thickness region has a thickness of $\frac{1}{4}\lambda$, wherein $\lambda$ is a desired wavelength. The matching layer can also have a first thickness region/second region ratio. In some cases, the ratio is greater than 1:1 and in other cases the ratio is less than 1:1.

The plurality of textures in the active layer surface can have any desired surface shape, depth shape or pattern. In some embodiments, the plurality of textures each have a circular-shaped surface shape. Also, in some cases, the circular-shaped surface shapes can be provided as a pattern of rows of circles. Further, in some cases, the plurality of textures can each have a street-shaped surface shape. The street-shaped surface shapes can also be provided as a pattern of intersecting streets or as a pattern of non-intersecting streets. In other cases, the plurality of textures can have a square depth shape or a concave depth shape.

In some embodiments, the matching layer can also include a single matching layer or a first matching layer and a second matching layer. In some cases, the matching layer includes a first matching layer and a second matching layer, wherein the first matching layer defines extensions that extend into the plurality of textures and the second matching layer does not extend into the plurality of textures. Also, the first matching layer and the second matching layer can include the same material or different material.

BRIEF DESCRIPTION OF DRAWINGS

The following drawings are illustrative of particular examples of the present invention and therefore do not limit the scope of the invention. The drawings are not to scale (unless so stated) and are intended for use in conjunction with the explanations in the following detailed description. Examples of the present invention will hereinafter be described in conjunction with the appended drawings, wherein like numerals denote like elements. Some embodiments will hereinafter be described in conjunction with the appended drawings, wherein like numerals denote like elements.

DETAILED DESCRIPTION

Figure 1:
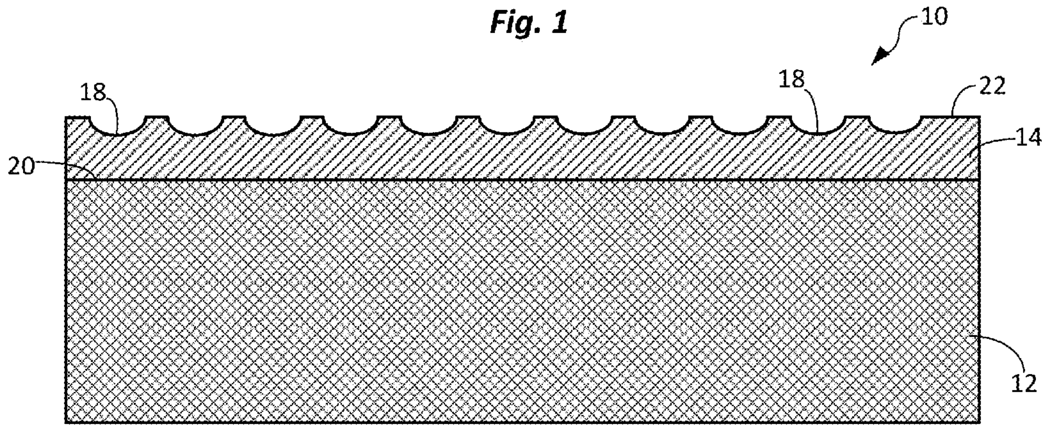
FIG. 1 is a side cross-section view of a portion of a transducer stack according to certain embodiments.

The following detailed description is exemplary in nature and is not intended to limit the scope, applicability, or configuration of the invention in any way. Rather, the following description provides some practical illustrations for implementing examples of the present invention. Examples of constructions, materials, dimensions, and manufacturing processes are provided for selected elements, and all other elements employ that which is known to those of ordinary skill in the field of the invention. Those skilled in the art will recognize that many of the noted examples have a variety of suitable alternatives.

This application provides embodiments of a transducer stack for use in an ultrasound transducer. In some cases, the transducer stack is a stack designed for use in an intravascular ultrasound (IVUS) transducer, an intracardiac echocardiography transducer, and transesophageal imaging transducer. In further cases, the transducer stack is a stack designed for use in a single-element transducer. In yet other cases, the transducer stack is a stack designed for use in a single-use transducer. Also, in some cases, the transducer stack is a stack designed for use in a transducer that operates in thickness mode. Of course, skilled artisans will understand that this application is not limited to the above-referenced transducers.

Referring generally to the Figures, the application provides embodiments of an ultrasound transducer stack 10. The transducers stacks 10 are illustrated as having rectangular shapes. However, skilled artisans will understand that the transducer stacks 10 can instead have other shapes, including square, circle, and oval shapes.

The ultrasound transducer stack 10 includes a backing layer 12, an active layer 14 and a matching layer 16. The backing layer 12 typically serves as a base and the active layer 14 is provided over the backing layer 12. The matching layer 16 is in turn provided over the active layer 14. When used herein, the term "layer" can mean a single layer or a plurality of sublayers. For example, a matching layer 16 can be a single layer or include a plurality of sublayers each making up the matching layer.

The active layer 14 receives voltage and vibrates to generate a sound wave. The backing layer 12 absorbs vibrations from the active layer 14 and dampens them. The matching layer 16 improves the efficiency of the transducer stack 10 to transmit ultrasound vibrations into the surrounding medium and to receive ultrasound vibrations from the surrounding medium. For example, the matching layer 16 provides a better acoustic impedance match between the active layer 14 and the medium (e.g., saline) in which transducer stack is located.

The backing layer 12 includes at least one backing layer. In some cases, the backing layer 12 includes a single backing layer. In other cases, the backing layer 12 includes a plurality of backing sublayers. In certain cases, the backing layer 12 includes an electrically conductive epoxy, such as a tungsten-loaded epoxy.

The active layer 14 includes at least one active layer. In some cases, the active layer 14 includes a single active layer. In other cases, the active layer 14 includes a plurality of active layers. The active layer 14 can also include a single material or a composite material. In some cases, the active layer 14 comprises a single ceramic piezoelectric material such as lead zirconate titanate, commonly known as PZT. In certain cases, the active layer 14 comprises a material having an electrical impedance of less than 50 ohms, less than 40 ohms or perhaps less than 30 ohms, such as 27 ohms. In other cases, the active layer 14 comprises a composite material such as lead magnesium niobate-lead titanate single crystal, commonly known as PMN-PT and polymer.

The matching layer 16 includes at least one matching layer. In some cases, the matching layer 16 includes a single matching layer. In other cases, the matching layer 16 includes a plurality of matching layers. In some cases, the matching layer 16 comprises an electrically conductive epoxy, such as a silver-loaded epoxy.

The transducer stacks 10 can also include at least one electrode layer (not shown), which can be formed from metal such as gold, chrome and/or titanium. In one example, the transducer stack 10 can include a thin electrode layer positioned between the backing layer 12 and the active layer 14 and/or between the active layer 14 and the matching layer 16. For example, in some cases, the thickness can be between 0.005 microns to 0.3 microns, depending on the metal. The electrode layer generally facilitates electrical excitation of the active layer 14. The transducer stack 10 can also be electrically connected to a signal generator (not shown) to electrically excite the transducer stack 10. The transducer stack 10 can also be electrically connected to a receiver (not shown) to detect pressure fields that are converted to electrical signals by the transducer stack 10.

Figure 7:
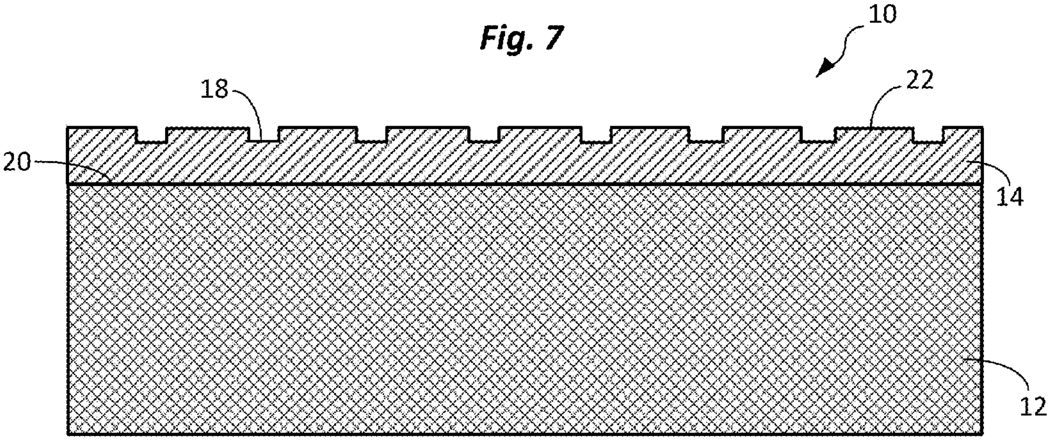
FIG. 7 is a side cross-section view of a portion of a transducer stack according to certain embodiments.

Referring to FIGS. 1 and 7, the active layer 14 includes a first surface 20 and a second surface 22. The first surface 20 faces (and sometimes directly contacts) the backing layer 12 and the second surface 22 faces the matching layer 16. The second surface 22 includes a plurality of textures 18. The textures 18 extend from the second surface 22 downward towards the first surface 20 as indentations, notches, recesses or cavities.

In certain embodiments, the textures 18 only partially extend downward from the second surface 22 towards the first surface 20. In some cases, active layer has a thickness or depth and the textures 18 extend downward for a depth of less than about ½ the depth of the active layer 14. In other cases, the textures 18 extend downward for a depth less than about ⅓ the depth of the active layer 14. As an example, the active layer 14 can have a thickness of about 50 μm and the textures 18 can extend downward at a thickness of about 16 μm so that a thickness of about 34 μm remains under each texture 18. The depth of the textures 18 can be selected depending on the desired performance characteristics of the transducer stack 10.

The textures 18 also have a desired surface shape. The surface shape is a shape of the texture as viewed from a top of an active layer, such as shown in FIGS. 2, 8, 13 and 14. For example, the textures 18 can have a circular, oval, square, rectangular or street surface shape. The desired surface shape of the texture 18 is also selected depending on the desired performance characteristics of the transducer stack 10.

The textures 18 also have a desired depth shape. The depth shape is the shape of the textures as they extend downward from the second surface 22 towards the first surface 20. For example, the textures 18 can have a spherical, parabolic, concave, square or rectangular depth shape. For example, in the embodiment shown in FIG. 1, the textures 18 have a concave depth shape and form concavities in the second surface 22. In the embodiment shown in FIG. 7, the textures 18 have a rectangular depth shape. The depth shape of the texture 18 is selected depending on the desired performance characteristics of the transducer stack 10.

The textures 18 can also be provided as a pattern on the second surface 22 of the active layer 14. The textures 18 can be distributed uniformly or unevenly across the second surface 22. In some cases, the textures 18 are spaced apart by a desired distance, such as a distance of between 5/1000 inch to 10/1000 inch. In other cases, the textures 18 have a surface diameter or width of between 3/1000 inch to 10/1000 inch. The appropriate size, number and location of textures 18 on the second surface 22 can also vary depending on the specific application of the transducer stack 10.

Figure 2:
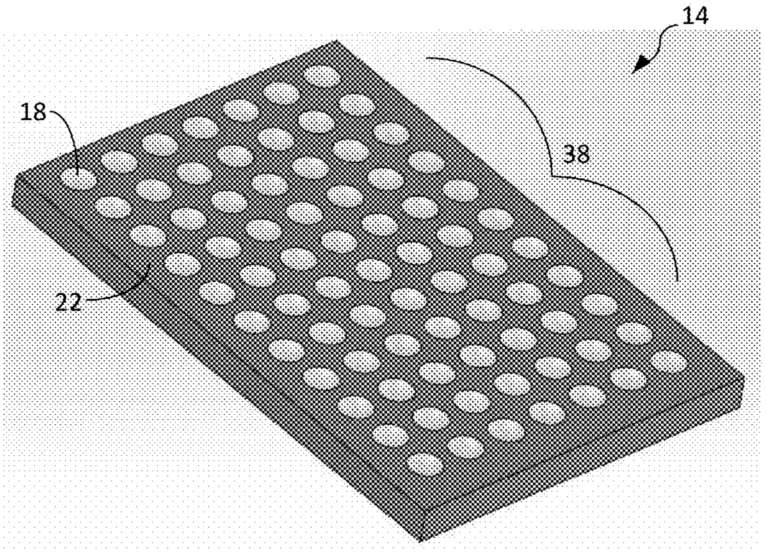
FIG. 2 is a perspective view of a portion of a transducer stack according to certain embodiments.
Figure 3:
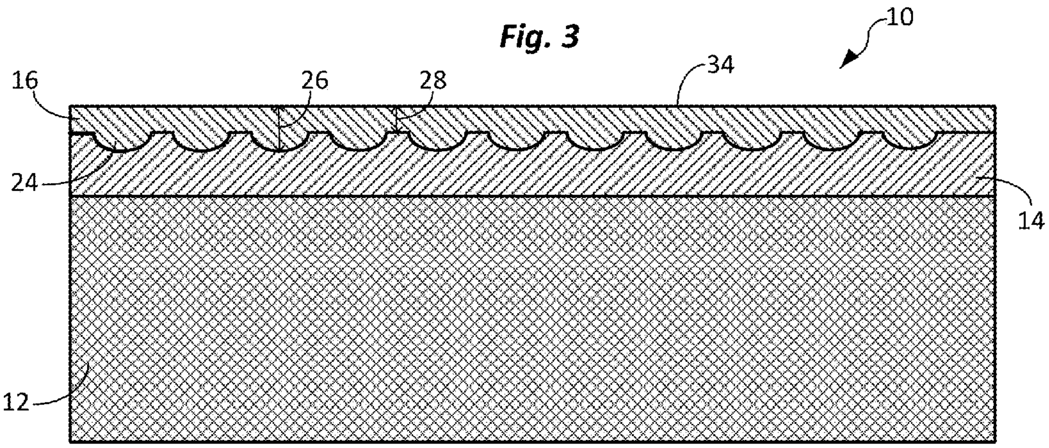
FIG. 3 is a side cross-section view of a portion of a transducer stack according to certain embodiments.
Figure 4:
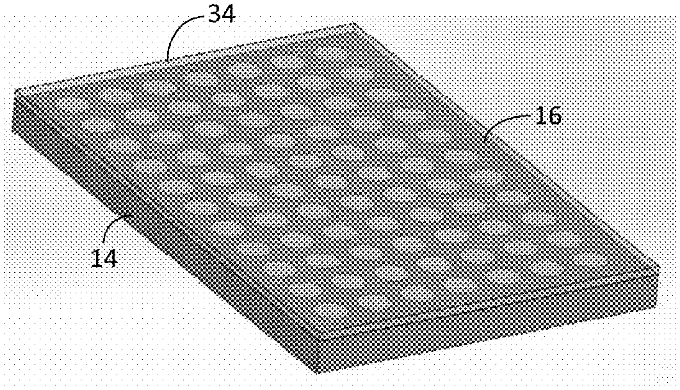
FIG. 4 is a perspective view of a portion of a transducer stack according to certain embodiments.
Figure 5:
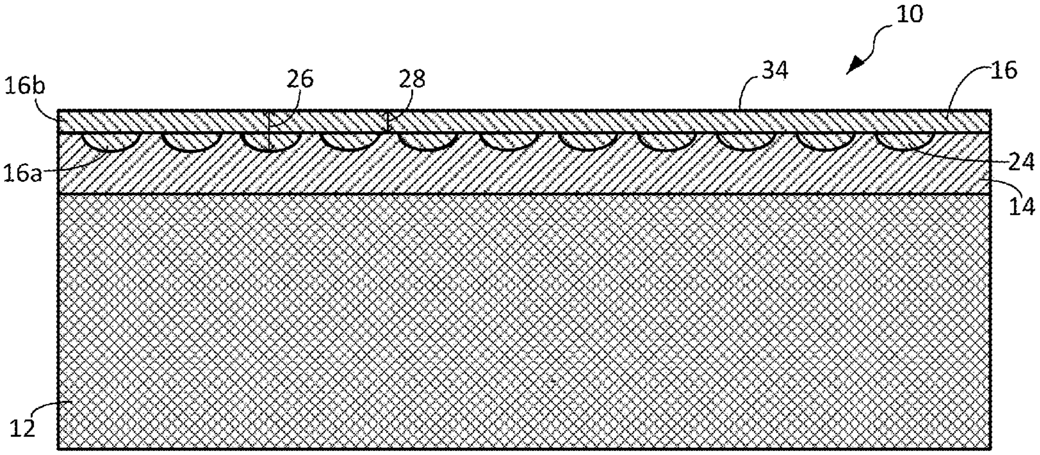
FIG. 5 is a side cross-section view of a portion of transducer stack according to certain embodiments.
Figure 6:
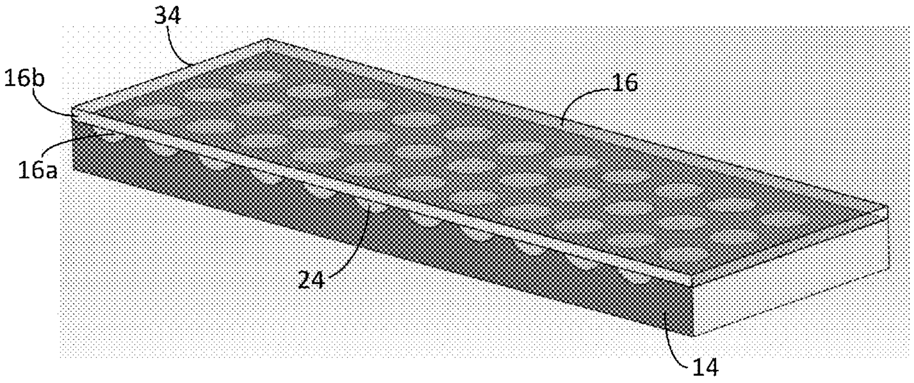
FIG. 6 is a perspective section view of a portion of a transducer stack according to certain embodiments.

In some cases, as best shown in FIG. 2, the textures 18 can be provided as a pattern of rows of circles 38. The row of circles 38 can include any desired number of rows and any desired number of circles within each row. Also, each row of circles can be spaced from another row of circles using any desired spacing dimensions. Finally, each circle within each row can be spaced from another circle using any desired spacing dimensions. The desired number of rows, number of circles, spacing between rows and spacing between circles can be selected depending on the desired performance characteristics of the transducer stack 10.

Figure 8:
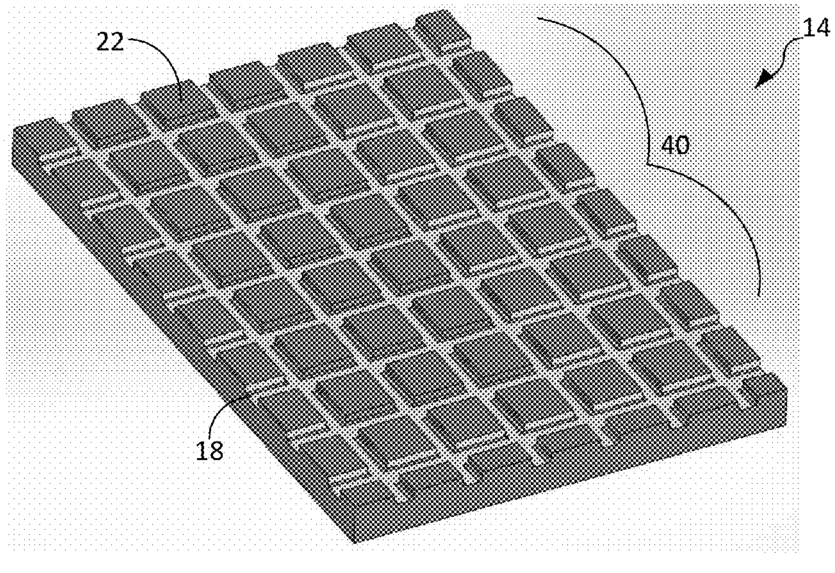
FIG. 8 is a perspective view of a portion of a transducer stack according to certain embodiments.
Figure 13:
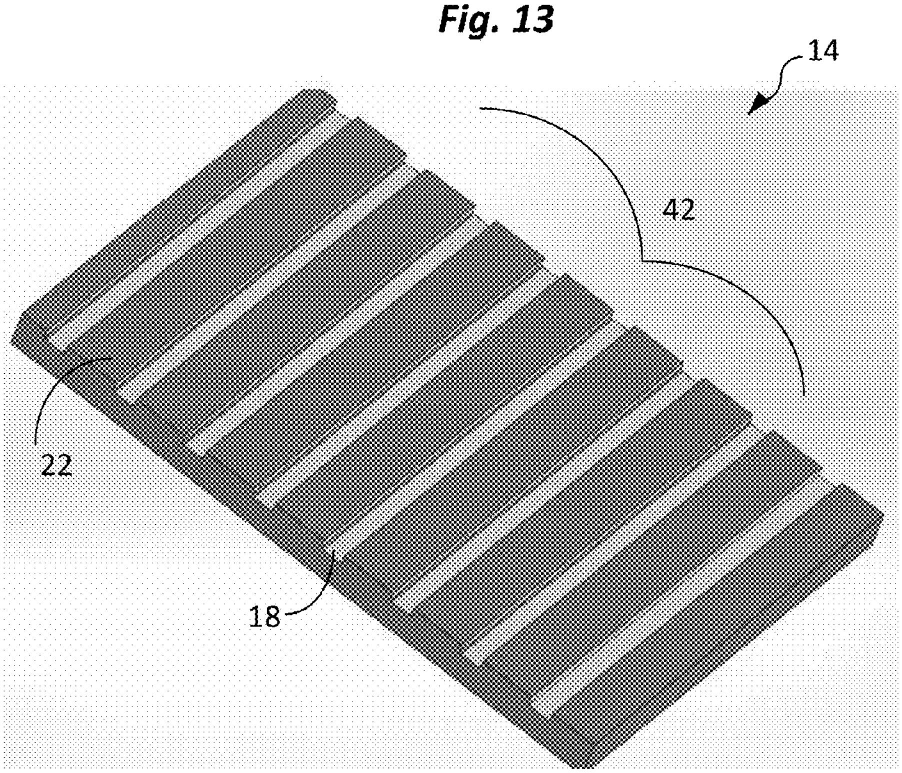
FIG. 13 is a perspective view of a portion of a transducer stack according to certain embodiments.
Figure 14:
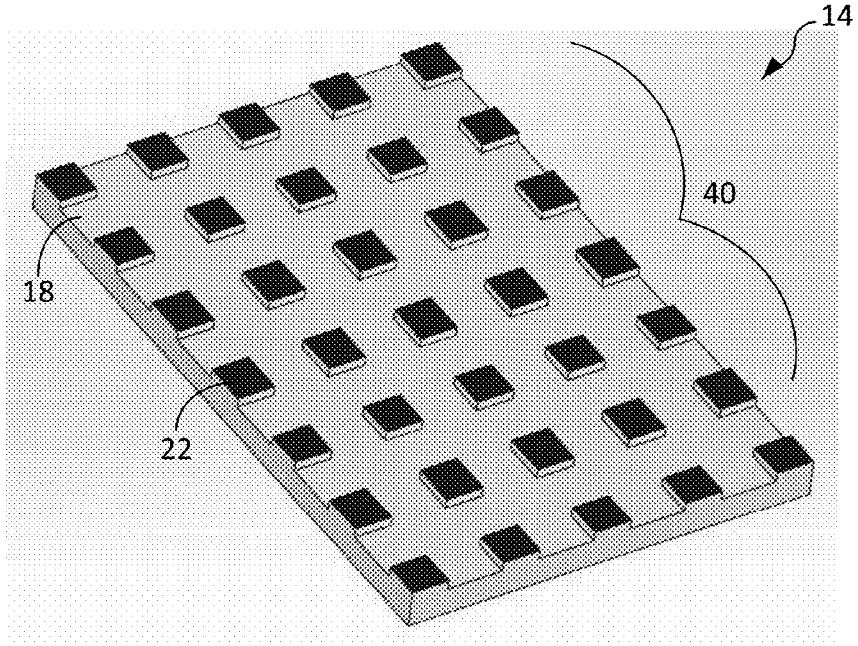
FIG. 14 is a perspective view of a portion of a transducer stack according to certain embodiments.

In other cases, the textures 18 are provided as a pattern of intersecting streets 40 that intersect one another, as best shown in FIGS. 8 and 14. The intersecting streets can intersect one another in any desired manner, such as a perpendicular manner or a diagonal or cross manner. In other cases, as shown in FIG. 13, the textures 18 are provided as a pattern of non-intersecting streets 42 that all run in a single direction. In these patterns, any desired number of streets can be provided.

Also, the streets can have any desired width. For example, the streets in FIG. 8 have a narrower width than the streets in FIG. 14. In some cases, the streets have a width between about 5/1000 inch and about 10/1000 inch. Likewise, the streets can have any desired depth. In certain cases, the streets have a depth of between approximately 10 microns and 20 microns. The depth will depend on the operating frequencies of the transducer. Further, the street depth can have any desired depth shape, such as a square depth shape, rectangular depth shape or a concave depth shape. The desired number of streets, width of streets, depth shapes and depth of streets can be selected depending on the desired performance characteristics of the transducer stack 10.

The textures 18 can be formed in the second surface 22 using any texture forming technique known in the art. In some cases, the texture forming technique is a subtractive technique. Suitable texture forming techniques include ablation, abrasion, blasting, machining, dicing, grinding and etching techniques. In some cases, a laser ablation technique can be used to create textures 18 in the second surface 22. For example, a $CO_2$ marking type laser, an eczema laser or a YAG type laser can be used to create textures 18 in the second surface 22.

A matching layer 16 is provided over the second surface 22 of the active layer 14. The matching layer has an outer surface 34 that faces away from the backing layer 12 and active layer 14. The matching layer 16 has a first thickness region 26 and a second thickness region 28. Each of the first thickness region 26 and the second thickness region 28 extend from the outer surface downward to the second surface 22 of the active layer 14.

The first thickness region 26 has a thickness that is larger than a thickness of the second thickness region 28. The first thickness region 26 also has extensions 24 that extend into the textures 18 created in the second surface 22 of the active layer 14. In other words, the extensions 24 "fill in" the textures 18. On the other hand, the second thickness region 28 does not extend into the textures 18 and instead overlies the second surface 22 of the active layer 14.

A matching layer having a first thickness region 26 and a second thickness region 28 allows the matching layer 16 to match at more than one ultrasound frequency. The first thickness region 26 matches at a first frequency and the second thickness region 28 matches at a second frequency. The first frequency is higher than the second frequency. In some embodiments, the first frequency is 60 MHz and the second frequency is 40 MHz. In other embodiments, the first frequency is a frequency in the range of 15-100 MHz and the second frequency is a frequency in the range of 1-15 MHz.

In some embodiments, the first thickness region 26 has a thickness of ¾λ and the second thickness region 28 has a thickness of ¼λ, wherein λ is a desired wavelength of the ultrasound vibration provided by the active layer. The use of such thickness regions 26, 28 widens the bandwidth of acoustic output that sends into the surrounding medium and widens the acoustic bandwidth that receives from waves that bounce back. The thickness regions 26, 28 also increase sensitivity to the returning waves.

The matching layer 16 can also be provided with a desired first thickness region/second thickness region ratio. The first thickness region/second thickness region ratio is selected depending on the desired performance characteristics of the transducer stack 10. For example, if the desired performance characteristic is a transducer stack 10 that generates equal pressure in the higher frequency and lower frequency, the first thickness region/second thickness region ratio can be 1:1. If the desired performance characteristic is a transducer stack 10 that generates more pressure in the higher frequency, the first thickness region/second thickness region ratio can be increased from 1:1 to 2:1, 3:1. 4:1 and so on. If the desired performance characteristic is a transducer stack 10 that generates more pressure in the lower frequency, the first thickness region/second thickness region ratio can be decreased from 1:1 to 1:2, 1:3, 1:4 and so on.

In some embodiments, as shown in FIGS. 3-4 and 9-10, the matching layer 16 is a single matching layer. Such a single matching layer 16 includes a single matching material. The matching layer can be a homogenous layer or perhaps a graded layer. In certain cases, the single matching layer 16 is a homogenous layer comprising an electrically conductive epoxy, such as a silver-loaded epoxy.

In other embodiments, as shown in FIGS. 5-6 and 11-12, the matching layer 16 includes a first matching layer **16*a* and a second matching layer 16*b*. Here, the first matching layer 16*a* defines the extensions 24 that extend into the textures 18 of the second surface 22 and the second matching layer 16*b* defines a layer overlying the extensions 24 and second surface 22. Certain portions of the second matching layer 16*b* directly contact the extensions 24 and other portions directly contact the second surface 22 of the active layer 14**.

In some embodiments, the first matching layer **16*a* and the second matching layer 16*b* are formed of the same material. This same material can be provided in a single concentration for each matching layer 16*a*, 16*b* or in different concentrations. For example, in some cases, the first matching layer 16*a* comprises a material "X" in a first concentration and the second matching layer 16*b* comprises the material "X" in a different concentration. In some cases, each the first matching layer 16*a* and the second matching layer 16*b* comprise a silver-loaded epoxy having the same concentration. In other cases, the first matching layer 16*a* includes a silver-loaded epoxy having a first volume concentration of silver and the second matching layer 16***b* includes a silver-loaded epoxy having a second volume concentration of silver.

In other cases, the first matching layer 16*a* comprises a first material and the second matching layer 16*b* comprises a second material, wherein the first material is different from the second material. For example, in some cases, the first matching layer 16*a* includes a silver-loaded epoxy and the second matching layer 16*b* includes a different material such as poxy (i.e., unloaded epoxy), parylene, and poly(vinylidenefluoride-co-trifluoroethylene (or P(VDF-TrFE). In other cases, the first matching layer 16*a* includes the different material and the second matching layer 16*b* includes a silver-loaded epoxy.

Figure 9:
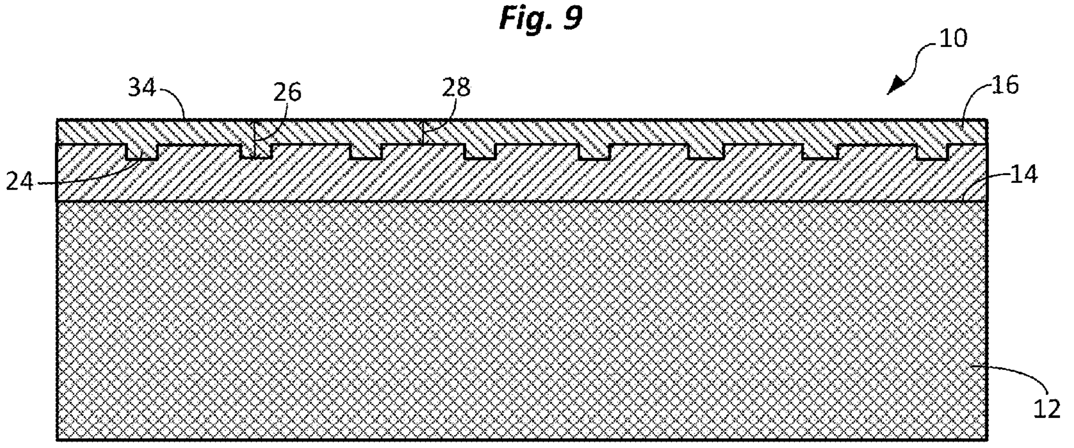
FIG. 9 is a side cross-section view of a portion of a transducer stack according to certain embodiments.
Figure 10:
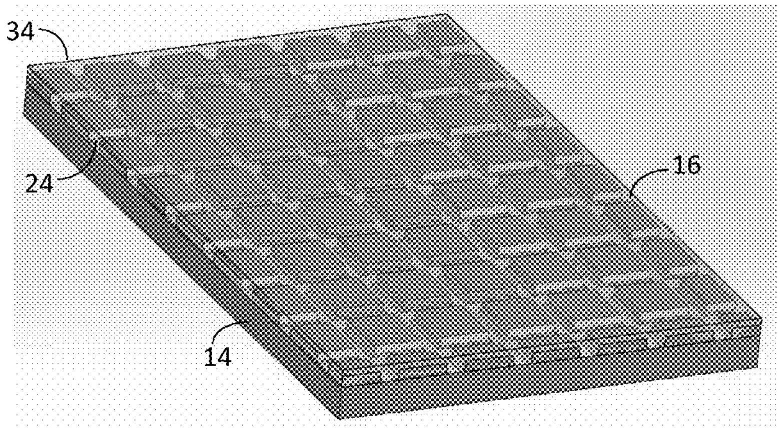
FIG. 10 is a perspective view of a portion of a transducer stack according to certain embodiments.
Figure 11:
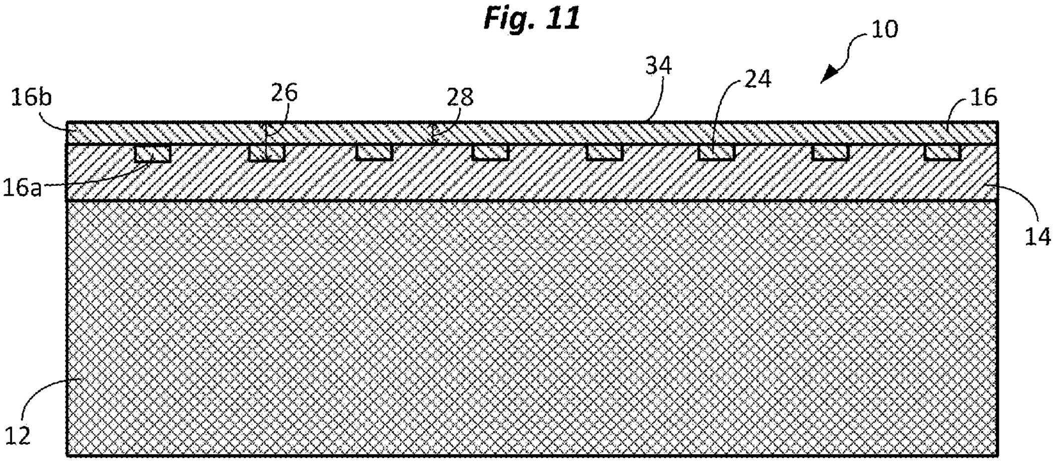
FIG. 11 is a side cross-section view of a portion of a transducer stack according to certain embodiments.
Figure 12:
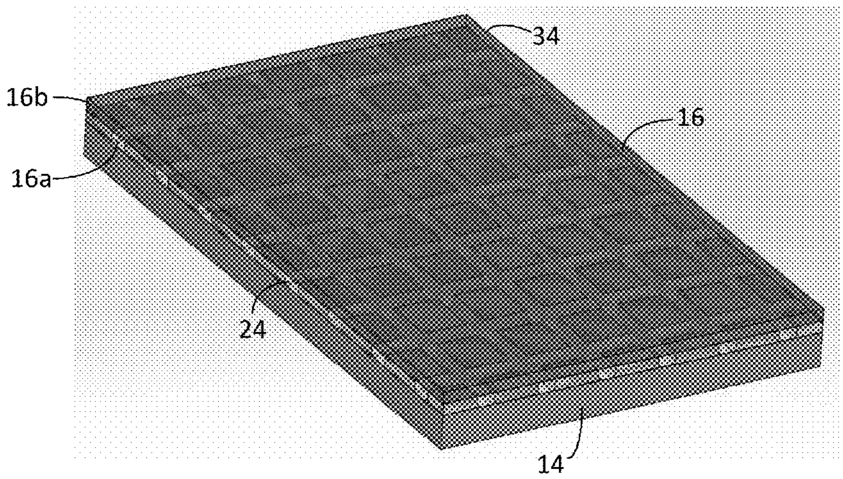
FIG. 12 is a perspective view of a portion of a transducer stack according to certain embodiments.

An exemplary embodiment will now be described with reference to FIG. 7. In this embodiment, active layer 14 is provided over the backing layer 12 at a thickness of about 50 μm. Next, textures 18 are created on the surface 22 of the active layer at a depth of about 17 μm. With reference to FIG. 9, a matching layer 16 is then provided over the active layer 14 such that the matching layer 16 has a first thickness region 26 extending into the textures 18 and a second thickness region 28 that does not extend into the active layer 14. The first thickness region 26 has a thickness of about 27 μm (wherein the active layer 14 directly beneath the first thickness region 26 has a thickness of about 34 μm) and the second thickness region 28 has at thickness of about 11 μm (wherein the active layer 14 directly beneath the second thickness region has at thickness of about 50 μm). The first thickness region 26 matches at a 60 MHz high frequency ¾λ location and the second thickness region 28 matches at a 40 MHz low frequency ¼λ location.

Figure 15:
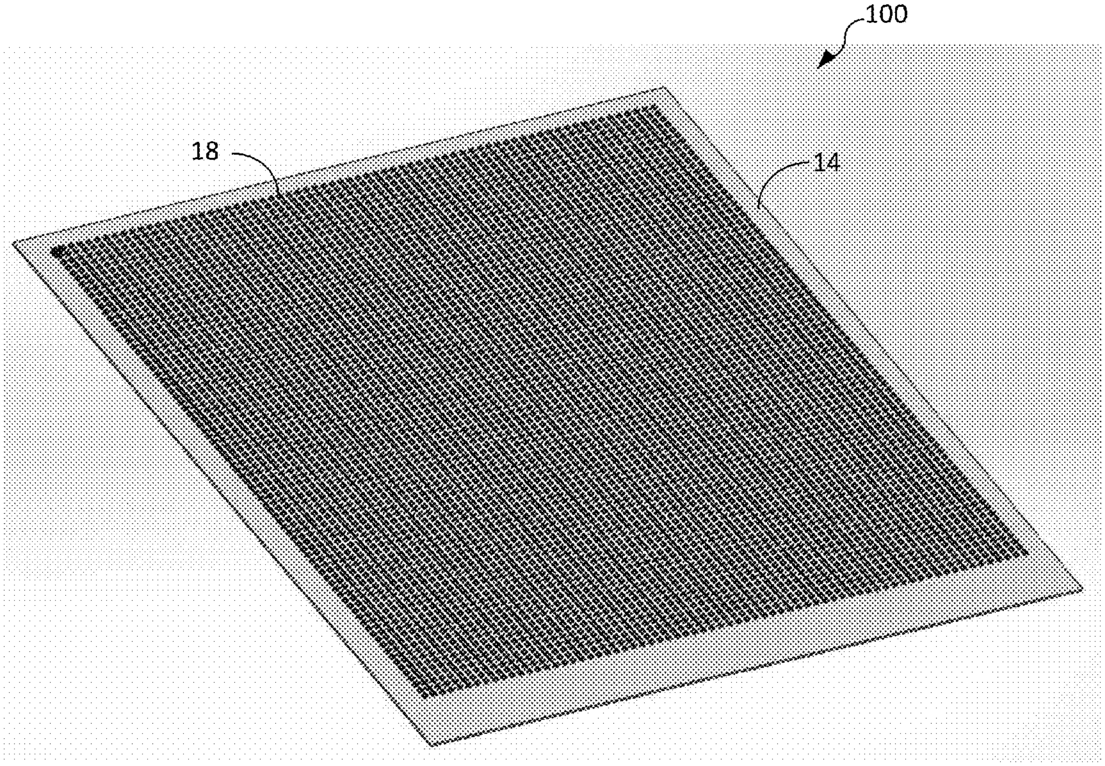
FIG. 15 is a perspective view of a wafer according to certain embodiments.

Some embodiments provide a method of manufacturing a transducer stack. The method first includes forming wafer 100 that includes steps of forming a backing layer 12, forming an active layer 14 over the backing layer 12, creating a plurality of textures 18 in the active layer 14, and forming a matching layer 16 over the plurality of textures 18. An exemplary wafer 100 is shown in FIG. 15. The method also includes cutting the wafer 100 into a plurality of segments, each segment being used as a transducer stack in an ultrasound transducer. Cutting techniques include machining, dicing, and etching.

Various examples of the invention have been described. Although the present invention has been described in considerable detail with reference to certain disclosed embodiments, the embodiments are presented for purposes of illustration and not limitation. Other embodiments incorporating the invention are possible. One skilled in the art will appreciate that various changes, adaptations, and modifications may be made without departing from the spirit of the invention and the scope of the appended claims.

What is claimed is:

1. An ultrasound transducer stack, comprising:

a backing layer;

an active layer overlying the backing layer, wherein the active layer has a surface comprising a plurality of textures, and wherein the plurality of textures each have a circular-shaped surface texture; and a matching layer overlying the active layer, wherein the matching layer has a first thickness region and a second thickness region, wherein the first thickness region has a larger thickness than a thickness of the second thickness region, wherein the first thickness region extends into the plurality of textures and the second thickness region does not extend into the plurality of textures.

2. The ultrasound transducer stack of claim 1 wherein the first thickness region matches a first frequency and the second thickness region matches a second frequency, wherein the first frequency is higher than the second frequency.

3. The ultrasound transducer stack of claim 2 wherein the first frequency is 60 MHz.

4. The ultrasound transducer stack of claim 3 wherein the second frequency is 40 MHz.

5. The ultrasound transducer stack of claim 1 wherein the first thickness region has a thickness of ¾λ and the second thickness region has a thickness of ¼λ, wherein λ is a desired wavelength.

6. The ultrasound transducer stack of claim 1 wherein the matching layer has a first thickness region/second thickness region ratio of greater than 1:1.

7. The ultrasound transducer stack of claim 1 wherein the plurality of textures is provided as a pattern of rows of circles.

8. The ultrasound transducer stack of claim 1 wherein the plurality of textures each have a concave depth shape.

9. The ultrasound transducer stack of claim 1 wherein the matching layer includes a first matching layer and a second matching layer.

10. The ultrasound transducer stack of claim 9 wherein the first matching layer defines extensions that extend into the plurality of textures and the second matching layer does not extend into the plurality of textures.

11. The ultrasound transducer stack of claim 9 wherein the first matching layer and the second matching layer comprise the same material.

12. The ultrasound transducer stack of claim 9 wherein the first matching layer and the second matching layer comprise different material.

13. The ultrasound transducer stack of claim 1 wherein the ultrasound transducer stack is part of an IVUS transducer.

14. A method of making an ultrasound transducer stack, comprising steps of: (a) forming a wafer comprising steps of: (i) providing a backing layer; (ii) providing an active layer overlying the backing layer; (iii) forming a plurality of textures on a surface of the active layer, wherein the plurality of textures have a circular-shaped surface texture; (iv) providing a matching layer over the surface of the active layer, wherein the matching layer has a first thickness region and a second thickness region, wherein the first thickness region has a larger thickness than a thickness of the second thickness region, wherein the first thickness region extends into the plurality of textures and the second thickness region does not extend into the plurality of textures; and (b) dividing the wafer into segments, wherein each segment forms an ultrasound transducer stack.

15. An ultrasound transducer stack comprising:

a backing layer;

an active layer having a first surface facing the backing layer and a second surface on a side of the active layer opposite the first surface, wherein the second surface comprises a plurality of textures; and a matching layer facing the second surface of the active layer, the matching layer comprising a first matching layer and a second matching layer having a first portion and a second portion, wherein the first matching layer extends into the plurality of textures, and wherein the first portion of the second matching layer contacts the first matching layer and the second portion of the second matching layer contacts the second surface of the active layer.

16. The ultrasound transducer stack of claim 15, wherein the plurality of textures only partially extend from the second surface toward the first surface.

17. The ultrasound transducer stack of claim 16, wherein the first matching layer fills in the plurality of textures.

18. The ultrasound transducer stack of claim 15, wherein the first matching layer comprises a first material and the second matching layer comprises a second material, and wherein the first and second materials are different.

19. The ultrasound transducer stack of claim 15, wherein the first matching layer and the second matching layer are of a material that is the same.

20. The ultrasound transducer stack of claim 19, wherein the first matching layer comprises the material in a first concentration and the second matching layer comprises the material in a second concentration, and wherein the first and second concentrations are different.

* * * * *